(12) United States Patent
Blank et al.

(10) Patent No.: US 11,212,918 B2
(45) Date of Patent: Dec. 28, 2021

(54) ELECTRICAL ASSEMBLY

(71) Applicant: Siemens Aktiengesellschaft, Munich (DE)

(72) Inventors: Rene Blank, Berlin (DE); Martin Franke, Berlin (DE); Peter Frühauf, Falkensee (DE); Rüdiger Knofe, Teltow (DE); Bernd Müller, Falkenberg (DE); Stefan Nerreter, Heidesee OT Blossin (DE); Jörg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/631,651

(22) PCT Filed: Jun. 19, 2018

(86) PCT No.: PCT/EP2018/066169
§ 371 (c)(1),
(2) Date: Jan. 16, 2020

(87) PCT Pub. No.: WO2019/015901
PCT Pub. Date: Jan. 24, 2019

(65) Prior Publication Data
US 2020/0170111 A1   May 28, 2020

(30) Foreign Application Priority Data
Jul. 18, 2017   (DE) .................... 10 2017 212 233.1

(51) Int. Cl.
*H05K 1/11*     (2006.01)
*H05K 1/18*     (2006.01)
(Continued)

(52) U.S. Cl.
CPC .......... *H05K 1/118* (2013.01); *H05K 1/0204* (2013.01); *H05K 1/0393* (2013.01); *H05K 1/18* (2013.01);
(Continued)

(58) Field of Classification Search
CPC .... H05K 1/118; H05K 1/0204; H05K 1/0393; H05K 3/361; H05K 2201/10166;
(Continued)

(56) References Cited

U.S. PATENT DOCUMENTS 5,769,237 A  *  6/1998  Althouse ............ H05K 13/0084
                                                         206/714
5,940,278 A  *  8/1999  Schumacher ...... G01R 1/07378
                                                         361/769
(Continued)

FOREIGN PATENT DOCUMENTS

EP   0 652 692 A1   5/1995   ............... H05K 1/00
WO   03/032391 A2   4/2003   ........... H01L 23/057
(Continued)

OTHER PUBLICATIONS

International Search Report and Written Opinion, Application No. PCT/EP2018/066169, 23 pages, dated Dec. 5, 2018.

*Primary Examiner* — Ishwarbhai B Patel
(74) *Attorney, Agent, or Firm* — Slayden Grubert Beard PLLC

(57) ABSTRACT

Various embodiments include an electrical assembly with: an electronic switching element electrically contacted on an underside and arranged on a flexible first wiring support; wherein the electronic switching element is electrically contacted on an upper side lying opposite the lower side; and a second wiring support arranged lying opposite the first wiring support on the upper side electrical contacting area of the electronic switching element. The first wiring support (Continued)

and the second wiring support each comprise a permanently elastic, electrically insulating, thermally conductive material.

5 Claims, 1 Drawing Sheet

(51) Int. Cl.
   *H05K 1/02* (2006.01)
   *H05K 1/03* (2006.01)
   *H05K 3/36* (2006.01)
(52) U.S. Cl.
   CPC .............. *H05K 3/361* (2013.01); *H05K 1/11* (2013.01); *H05K 2201/10166* (2013.01); *H05K 2201/10598* (2013.01)
(58) Field of Classification Search
   CPC ......... H05K 2201/10598; H05K 3/326; H05K 2201/0162; H05K 1/145; H05K 1/0326; H05K 1/0373; H05K 1/056; H05K 1/189; H05K 3/325; H05K 2201/0133; H01L 23/5385; H01L 24/33; H01L 23/49866; H01L 2224/33181; H01L 25/072; H01L 2924/351; H01L 24/32; H01L 24/29; H01L 2224/32225
   See application file for complete search history.

(56) References Cited

U.S. PATENT DOCUMENTS

| | | | |
|---|---|---|---|
| 6,442,033 B1* | 8/2002 | Liu | H01L 23/5385 361/743 |
| 6,545,226 B2* | 4/2003 | Brodsky | H05K 3/325 174/260 |
| 6,623,864 B1* | 9/2003 | Sweet | B32B 7/12 428/447 |
| 6,722,893 B2* | 4/2004 | Li | G01R 1/0466 439/591 |
| 7,352,585 B2* | 4/2008 | Mandel | H01L 21/4878 361/714 |
| 2014/0242816 A1* | 8/2014 | Rathburn | H01R 12/52 439/68 |
| 2015/0049443 A1 | 2/2015 | Meyer-Berg | 361/749 |
| 2015/0062825 A1* | 3/2015 | Ossimitz | H01L 23/4006 361/719 |
| 2017/0117162 A1* | 4/2017 | Busche | H01L 23/49822 |

FOREIGN PATENT DOCUMENTS

| | | | |
|---|---|---|---|
| WO | 2013/130363 A1 | 9/2013 | ............ H01M 10/48 |
| WO | 2019/015901 A1 | 1/2019 | ............... H05K 1/14 |

* cited by examiner

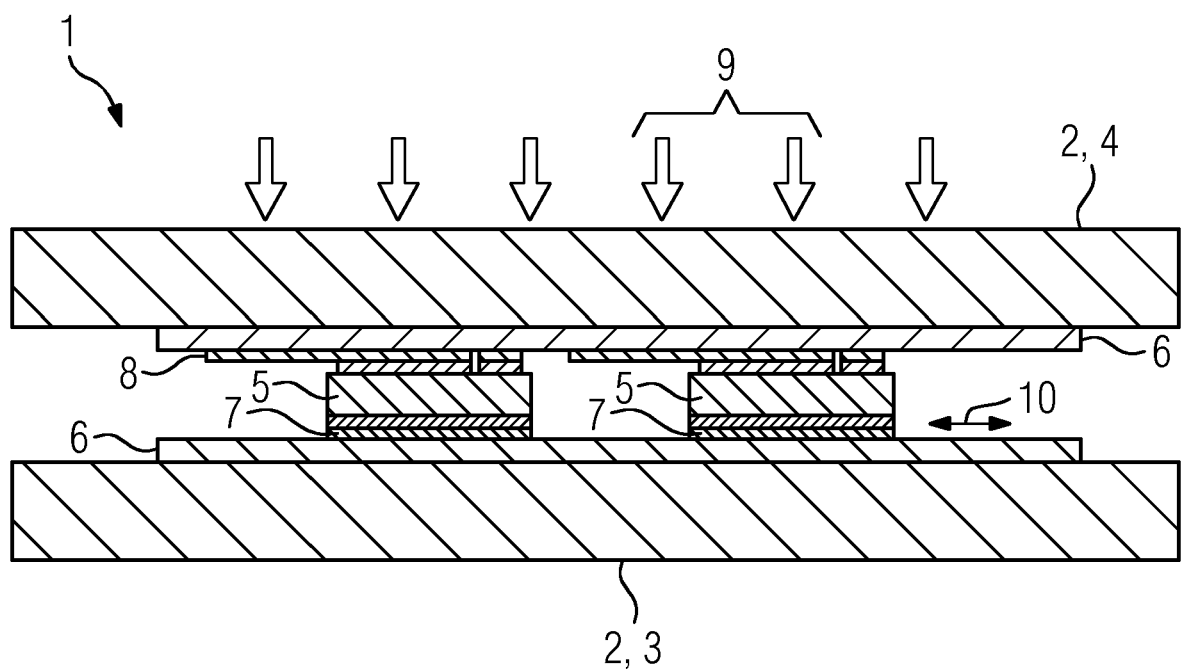

ELECTRICAL ASSEMBLY

CROSS-REFERENCE TO RELATED APPLICATIONS

This application is a U.S. National Stage Application of International Application No. PCT/EP2018/066169 filed Jun. 19, 2018, which designates the United States of America, and claims priority to DE Application No. 10 2017 212 233.1 filed Jul. 18, 2017, the contents of which are hereby incorporated by reference in their entirety.

TECHNICAL FIELD

The present disclosure relates to electrical assemblies. Various embodiments may include an electrical assembly with a flexible wiring support.

BACKGROUND

Nowadays electrical and electronic assemblies and circuit arrangements are becoming not only increasingly more complex, but in such cases are also to be miniaturized even more and have their performance increased. Various problems are produced by this combination of requirements in terms of the layout and connection technology and also during operation of the corresponding assemblies or circuits. For example, layout concepts are increasingly employed in which semiconductor elements are mounted directly, meaning that they are not encapsulated in a corresponding housing. The usual way of establishing contact with the semiconductor elements has previously been to connect them mechanically, thermally, and electrically in a planar manner by integrally bonded connections. In this way a tolerance chain can be built up over a plurality of components. Adhering to a predetermined short-circuit tolerance for example at a possible jointed connection height on one side of a semiconductor frequently imposes demands on the components affected by the tolerance that are critical and difficult to adhere to. Nowadays it is here that a limit to production that can be efficiently sensibly realized at affordable cost is frequently reached.

Thermomechanical behavior of such assemblies or circuits represents a further demand that is increasingly relevant. For functional reasons, materials or components with widely differing coefficients of thermal expansion must frequently be employed. These can be glass fiber or epoxy materials for organic wiring supports for example with a coefficient of thermal expansion of around $15$-$18 \times 10^{-6}$ $K^{-1}$, aluminum oxide ceramics with a coefficient of thermal expansion of around $7 \times 10^{-6}$ $K^{-1}$ or also the aluminum frequently used for heat sinks with a coefficient of thermal expansion of around $23 \times 10^{-6}$ $K^{-1}$. With conventional assemblies or constructions these or similar materials can be integrally bonded to one another in order to insure a mechanical, thermal, and electrical functionality. In particular, at temperatures beyond the jointing temperatures and/or with temperature differences between the different materials, such as can occur during regular operation, the different coefficients of thermal expansion, which means the differences in the respective thermomechanical behavior, can lead to undesired expansion mismatches, i.e. to damaging differences in expansion.

A known approach to solving this problem consists of a geometrical material optimization. Here an attempt is made, by skillful arrangement and selection of different materials, to overcome the said problems. For example, where greatly differing expansions or changes in expansion are to be expected, jointing materials with an especially high resistance to changing loads, for example enhanced-performance solders or sinter materials, can be employed or materials with greatly differing coefficients of expansion can be avoided from the outset. This can however lead to significantly increased costs and/or to a restricted functionality. This approach to a solution is also not readily scalable with the increasing miniaturization and increased performance.

WO 03/0 323 91 A2 describes a method for forming a package for electronic components and a package of this type. The package has a number of sheet-like elements stacked in layers, including a cooling element, a flexible substrate, which has an electrically conductive layer and carries an electronic component, an electrically insulating gap filler and a cover. A pressure is exerted on this stack arrangement in order to establish a mechanical contact between the flexible substrate and the heat sink.

SUMMARY

The teachings of the present disclosure describe electrical assemblies with especially good thermomechanical behavior, which can be produced with precision with especially little effort and which makes possible a flexible, even complex functionality. For example, some embodiments include an electrical assembly (1), having an electronic switching element (5), which is electrically contacted (7) on an underside and is arranged on a flexible first wiring support (2, 3) of the electrical assembly (1), characterized in that the electronic switching element (5) is additionally electrically contacted (8) on an upper side lying opposite the lower side, the electrical assembly (1) has a second wiring support (2, 4), which is arranged lying opposite the first wiring support (2, 3) on the upper side electrical contacting area (8) of the electronic switching element (5), and the first and the second wiring supports (2, 3, 4) are each formed at least in part from a permanently elastic, electrically insulating, thermally conductive material (6).

In some embodiments, the electronic switching element (5) has at least one power semiconductor (5).

In some embodiments, the permanently elastic material (6) of the first and/or of the second wiring support (2, 3, 4) is pressed onto a metallic support.

In some embodiments, the respective metallic support is embodied as a cooling element for cooling the electrical assembly (1).

In some embodiments, in all connection planes of the electrical assembly (1), in which in each case at least two components (2, 3, 4, 5, 6, 7, 8) are connected to one another, the respective components (2, 3, 4, 5, 6, 7, 8) are connected to each other by a force fit while foregoing an integrally bonded connection.

In some embodiments, the permanently elastic material (6) of the first and/or the second wiring support (2, 3, 4) forms a layer (6), which rests directly against the respective electrical contacting area (7, 8) of the electronic switching element (5).

In some embodiments, the permanently elastic material (6) of the first and/or the second wiring support (2, 3, 4) contains a polysiloxane and a further component, in particular metal oxide particles and/or ceramic particles.

As another example, some embodiments include a method for producing an electrical assembly (1), in which to join the assembly (1) together, an external compressive force (9) is exerted on a first outer wiring support (2, 3, 4) of the assembly (1) and on a second outer wiring support lying opposite the first one, which are each formed at least in part from a permanently elastic, electrically insulating, thermally conductive material (6), wherein at least one electronic switching element (5) is arranged between the wiring supports (2, 3, 4), and through the compressive force (9), while foregoing integrally bonded connections, thermal and or electrical contacting at least of the at least one switching element (5) is established on an underside facing towards the first wiring support (2, 3) and on an upper side of the switching element (5) facing towards the second wiring support (2, 4).

In some embodiments, the components (2, 3, 4, 5, 6, 7, 8) of the assembly (1) are provided with tolerances so that, before the compressive force (9) is exerted, a minimum dimension of the assembly (1) at right angles to a connection plane between the at least one electronic switching element (5) and the wiring supports (2, 3, 4) is at least as large as a required dimension of the completed assembly (1), and through the compressive force (9) the permanently elastic material (6) of the first and/or of the second wiring support (2, 3, 4) is deformed and the assembly (1) is thereby set to the required dimension.

BRIEF DESCRIPTION OF THE DRAWINGS

Further features, details, and advantages of various embodiments of the teachings of the present disclosure emerge from the description given below of exemplary embodiments and also with reference to the drawing. In the drawing, the sole FIGURE shows a schematic cross-sectional side view of an example of an electrical assembly with two electronic switching elements contacted on both sides, which are arranged between two wiring supports, in particular between two layers made of a permanently elastic, electrically insulating material, thermally conductive material.

DETAILED DESCRIPTION

In some embodiments, an electrical assembly has at least one electronic switching element, which is electrically contacted on its underside and is arranged on a flexible first wiring support of the electrical assembly. In some embodiments, the electronic switching element may be electrically contacted additionally on an upper side lying opposite the underside. Moreover, the electrical assembly may include a second wiring support, which is arranged on the upper-side electrical contacting area of the electronic switching element opposite the first wiring support. In some embodiments, the first and the second wiring support are each at least in part, i.e. at least in some areas, made of a permanently elastic, electrically insulating, thermally conductive material.

The two-sided electrical contacting of the switching element enables especially complex functionalities of the electrical assembly overall and the electronic switching element specifically to be realized. The two-sided electrical contacting can likewise provide an especially great flexibility in the realization or implementation of respective functionalities required. It is precisely for power electronics components that the respective line cross-sections cannot readily be reduced, so that the two-sided electrical contacting enables more lines or connections to be routed to the electronic switching element. A further advantage of the two-sided electrical contacting and of the permanently elastic, thermally conductive areas of material or layers of the respective wiring support arranged on both sides, i.e. below the underside and above the upper side of the electronic switching element, is that heat arising during operation of the electrical assembly can be dissipated by the electronic switching element in the two opposite directions. The suggested package can thus make possible an improved temperature or heat management and thereby a higher electrical and/or thermal loading capacity and/or power density within the electrical assembly or within the electronic switching element without damaging it.

To overcome the problems and challenges stated at the outset, the solution proposed here makes use of an integration of a number of functions or functionalities in the wiring supports. Thus the elasticity of the wiring supports—or of the corresponding permanently elastic areas of material of the wiring supports—makes it possible, during a production, assembly or joining-together process of the electrical assembly, for compressive forces applied, in particular applied essentially to the underside and the upper side of the electronic switching element, to be accepted without damage. This thus makes possible a height-adaptive bringing together of the mating parts to be joined, i.e. of the components, of the electrical assembly. In other words, the elasticity of the wiring support can be utilized for balancing out the tolerances, i.e. for adhering to the predetermined short-circuit tolerance of the entire electrical assembly. A corresponding tolerance chain of the electrical assembly may be flexibly relieved by the flexible final dimension of the electrical assembly as a result of the flexibility of the wiring support, is thus able to be adhered to with less effort.

In addition to this balancing out of tolerances, the elasticity of the wiring support offers the opportunity to balance out the differences in thermal expansion, i.e. different coefficients of thermal expansion and/or different temperatures of the joined elements of the electrical assembly, in particular under changing electrical and/or thermal load. Such differences in expansion can become damaging in conventional assemblies or constructions, meaning that they can lead to damage to or accelerated ageing of the respective electrical assembly or of the respective package or of individual components. The elasticity of the wiring support prevents or reduces a buildup of, in particular mechanical, strains caused thermally or of mechanical stress within the electrical assembly.

In some embodiments, the respective permanently elastic material of the wiring support can provide a mechanical flexibility or elasticity in different spatial directions. This means that the permanently elastic material is not only able to be deformed in a first direction at right angles to the underside and the upper side or to the corresponding surfaces or a corresponding main extension plane of the electronic switching element without damage, but also at least in a second direction, which can extend at right angles to the first direction. In other words, the respective permanently elastic material can thus also accept deformations or differences in expansion in or in parallel to a connection plane between two components of the electrical assembly without damage. This connection plane can be arranged in parallel to the upper side and the underside of the plane(s) of the main extent of the electronic switching element for example.

In some embodiments, the electrical assembly can be a stack of components, i.e. have a stack-like structure or a stack-like package. The individual components can have a planar extent, i.e. a layer-like form or shape, i.e. each form a layer or a part of a layer of the stack or of the electrical assembly. The permanently elastic material can then be able to be deformed without damage both at right angles to the individual layers, i.e. in the stack direction, and also in parallel to the layers, i.e. at least essentially at right angles to the direction of the stack. In this way for example an external heat sink, i.e. arranged outside on the electrical assembly or forming an outer side of the electrical assembly, can expand further transverse to the direction of the stack during operation of the electrical assembly, i.e. have a greater relative change in length, than for example the contacting area lying further inside or the electronic switching element likewise lying further inside.

These differences in expansion are accepted by the intervening permanently elastic material, i.e. are balanced out, so that any damage, for example cracking of the cooling element, of the contacting, of the switching element or of corresponding connections can be avoided.

In some embodiments, even complex electrical assemblies can be realized with improved thermomechanical behavior and higher electrical and/or thermal loading capacity, wherein at the same time, with relatively little effort compared to known methods, predetermined tolerances for a size, in particular a height, of the electrical assembly can be adhered to. By using the permanently elastic material on both sides, especially high-performance materials in their respective individual functionality can advantageously be used for other components of the electrical assembly, even if said components have a significantly different thermomechanical behavior or coefficients of thermal expansion. Thus, compromises previously needed in the choice of materials can be avoided and an overall improvement in the performance of the electrical assembly can be achieved.

An electrical or electronic assembly can be understood in the sense of the present disclosure as a constructive and/or functional composite or as a constructive and/or functional unit made of integrated and/or discrete active and/or passive components or modules. These components or modules can be electrically connected to one another by a network of electrical lines. The permanently elastic, electrically insulating, thermally conductive material in such cases in most cases, is not involved in any way in an electrical or electronic signaling or data processing or transmission function of the electrical assembly. It can serve for example as a support for at least a part of the electrical line network, as an electrical contacting area and/or at least one other component of the electrical assembly.

In some embodiments, the permanently elastic material can form a subarea, in particular a layer, of the respective wiring support. A remainder or remaining area of the respective wiring support can thus be formed from another material. This enables a mechanical stability, for example a resistance to bending, of the electrical assembly to be improved without foregoing the benefits obtained by using the permanently elastic material. The permanently elastic, electrically insulating material with good thermal conductivity can be selected from known materials with these properties—in individual cases as per individual requirements for example. The various embodiments do not require a specific composition of this or of such a material, since suitable materials are basically known.

Components of the present electrical assembly are for example the electronic switching element and the wiring support. The electrical contacting area or a corresponding electrical contacting layer can also be understood as components. Above and beyond this the electrical assembly can have further components, for example cooling elements, mechanical supports, sensors and more besides.

In some embodiments, the electronic switching element has at least one power semiconductor. The electronic switching element can in other words comprise one or more chips of a power electronics unit. Various embodiments of the teachings herein can be employed to particular advantage in electrical assemblies that have power electronics components or elements or on the one hand combine or integrate power electronics and on the other hand logic or computation components with one another. Through the use of power electronics components, a higher power loss occurs within such an assembly, which makes it important effectively to manage the thermomechanical behavior of the assembly. Relatively high temperatures caused by this relatively high-power loss have a generally disadvantageous effect on logic circuits or computation devices within the assembly. Despite this the aim is increasingly for a higher physical packing density—also of different components, for example to drive miniaturization forwards and to reduce signal delay times. Practical application cases in which the various embodiments may be used to advantage are for example photovoltaic systems, inverters, controls, and power distributors for electric motors and more besides.

In some embodiments, the permanently elastic material of the first and/or second wiring support is pressed onto a metallic support. The permanently elastic material can thus be connected by a force fit to the respective metal support. In this case an integrally bonded connection can be dispensed with. The compression means that a mechanical and thermal, in particular thermally-conductive, contact between the permanently elastic material and the respective metallic support is established or insured by a force, which acts at right angles to a connection or contact surface or plane between the permanently elastic material and the respective metallic support. The force in this case can be exerted evenly over the entire surface of this contact plane or predetermined contact areas, i.e. part areas of the overall contact surface can be pressed onto one another to make a force fit.

Because of the elasticity, i.e. the deformability of the permanently elastic material, an optimal contact between the permanently elastic material and the metallic support can even be established or insured here without a integrally bonded connection, since for example unevenesses or structural features of the respective metallic support can be filled or compensated for by the permanently elastic material. Since the permanently elastic material is also thermally conductive, dissipated heat and power loss heat arising in the electrical assembly can in this way be especially effectively and efficiently transferred by the permanently elastic material to the metallic support or can be discharged.

The metallic support, because of its especially good thermal conductivity, can then distribute this heat especially effectively and efficiently or discharge it into a surrounding space. At the same time a possible expansion mismatch, i.e. a damaging difference of the relative and/or absolute changes in length resulting from heat of the relevant metallic carrier on the one hand and of a further component of the electrical assembly arranged on another side, in particular on an opposite side of the permanently elastic material, can then be avoided by the elasticity of the permanently elastic material.

In some embodiments, the elasticity of the permanently elastic material also enables an optimum heat flow, even under significant thermomechanical load, i.e. an effective and efficient dissipation of heat loss from the electrical assembly to be achieved, since mechanical stress is compensated for and in this way the best possible thermal and mechanical contact can be maintained.

The metallic support in this case can provide or improve a mechanical stability, for instance against deformation, and also protection against damage to the electrical assembly from mechanical effects. To this end the metallic support can be arranged further outwards in relation to a middle or central plane of the electrical assembly, i.e. further from a middle point of the electrical assembly, than the permanently elastic material. The permanently elastic material can in other words thus be arranged lying on the inside of the respective metallic support. The metallic support can be part of the respective first or second wiring support. In other words, the respective permanently elastic material and the respective metallic support can together form the respective wiring support.

Naturally the respective wiring support can also have further components, elements, or constituent parts. If the respective metallic support is part of the respective wiring support, then advantageously an especially high function density can be realized, since the wiring support constructed in such a way from a number of different areas or materials can combine or fulfill a number of functions in one component. Thus, a corresponding further element for at least one of these functionalities can be saved.

In order to achieve an especially high function density of the electrical assembly, the metallic support can assume a cooling function for example. In some embodiments, the respective metallic support may be embodied as a cooling element for cooling the electrical assembly. In other words, the functionalities of a wiring support and a cooling element can thus be unified or combined in one single component by the wiring carrier. The fact that the metallic support is embodied as a cooling element can mean for example that the respective metallic support forms an outer side or surface of the electrical assembly, so that it can radiate or emit heat to the respective environment of the electrical assembly. To this end the outer or upper side of the respective metallic support facing away from the permanently elastic material can have cooling fins for example and be formed in a different way, in order to achieve an enlarged surface and thus a greater heat discharge capability.

Likewise, the metallic support can be embodied for example to be connected to a cooling circuit or to a coolant circuit. For this the metallic support can have appropriate receptacles or fastening elements for example, by means of which it can be connected to external cooling or to a cooling device or have a heat-conducting link to external cooling or to a cooling device. As a result of this thermal conductivity and its mechanical stability and loading capacity the metallic support is especially suitable for this purpose. Likewise, the metallic support can have a drilled hole or a channel through which a coolant or cooling medium can flow through the metallic support. In this way an especially efficient heat transport can be achieved.

In some embodiments, in all connection planes of the electrical assembly, in which in each case at least two components are connected to each other, the at least two respective components are connected to each other by a force fit while dispensing with a integrally bonded connection. In other words, the components of the electrical assembly can thus be separated from one another without destroying them by dispensing with integrally bonded connections. The fact that the electrical assembly is produced and held together using construction and joining measures or methods acting using a forced fit enables an improved thermomechanical, thus ultimately also an electrical loading capacity of the electrical assembly overall to be achieved. This is the case since the force-fit joints or connections can allow the individual components to slide on one another. Thus, the individual components, which in particular can have different coefficients of thermal expansion and/or different temperatures, can expand or contract independently of one another, without this leading to damaging mechanical stress or to corresponding mechanical strains within the electrical assembly.

In order to safeguard the functionality of the electrical assembly despite dispensing with integrally bonded joining, electrical and/or thermal contacts can be made by force fit compression or pressing together suitable contact surfaces or contact areas of the respective components. This can be realized permanently for example by one or more spring elements, by one or more clamps, by one or more screw connections and/or the like. These spring elements, clamps and/or screw connections or the like can thus be part or parts of the electrical assembly. For example for connection planes in this sense a plane, i.e. a boundary or connection surface in which a heat sink or cooling element of the electrical assembly is linked to a further component of the electrical assembly lying further within it is likewise included, as is the plane in which the electrical switching element on its upper side or lower side is electrically and/or thermally contacted.

In addition to the force-fit connection or force-fit connections, the electrical assembly can have one or more form-fit connections. Through these for example a displacement of two components relative to one another and/or a movement of one or more components within the electrical assembly can be limited, in order to maintain or to guarantee the predetermined structure and the functionality of the electrical assembly.

In some embodiments, the permanently elastic material of the first and/or of the second wiring support forms a layer which rests directly on the respective electrical contacting of the electronic switching element. The permanently elastic material of the first wiring support can thus for example carry or accept an electrical contacting layer or an electrical line, by means of which the underside of the electronic switching element is electrically contacted. In a corresponding way the permanently elastic material of the second wiring support can carry or accept an electrical contacting layer or an electrical line, by means of which the upper side of the electronic switching element is electrically contacted.

The permanently elastic material of the wiring support can be a dielectric at least partly surrounding the electronic switching element on the underside and/or the upper side, i.e. a dielectric layer or coat within the electrical assembly.

The arrangement of the permanently elastic material directly on the electrical contacting of the electronic switching element, i.e. at a minimal distance from it, may improve the thermomechanical behavior of the electrical assembly, since the lost heat to be dissipated can arise in the electronic switching element. The elasticity of the permanently elastic material on the one hand enables a maximum contact surface for heat dissipation to be realized with minimal production effort, since the permanently elastic material adapts to the electrical assembly and even automatically to local deformations. The permanently elastic material provides an especially good ability to adapt to shape, which may lead to an especially low thermal resistance to and from the permanently elastic material.

On the other hand, maximum temperatures, temperature fluctuations and/or temperature gradients can occur at this point. The arrangement of the permanently elastic material directly on the electrical contacting of the electronic switching element—and if necessary also at least in some areas on the electronic switching element itself—enables thermomechanical effects, such as for example potentially damaging expansion mismatches in conventional structures, to be caught or compensated for.

While known conventional electrical assemblies often have an asymmetrical construction, various embodiments of the teachings herein enable a symmetrical construction or a symmetrical structure to be realized. In such cases, the arrangement of the same permanently elastic material both at or on the underside and also at or on the upper side of the electronic switching element enables an especially even heat dissipation from the electronic switching element to be achieved.

A symmetrical removal of heat of this kind from the electrical switching element enables a temperature gradient or a thermomechanical stress arising within the electronic switching element to be avoided. This cannot be insured with conventionally known electrical assemblies in which for example a filler material or an encapsulation mass is arranged on one side of the electronic switching element, since the different materials on the upper side and the lower side of the electronic switching element usually have different thermal conductivities and thermal capacities.

In some embodiments, the permanently elastic material of the first and/or the second wiring support contains a polysiloxane and a further component, in particular metal oxide particles and/or ceramic particles. This represents a tried and tested option for creating a permanently elastic material with the desired thermal, mechanical and electrical properties.

In some embodiments, there is a method for producing an electrical assembly. In some embodiments, to join together the assembly, an external compressive force is exerted on an external first and on an opposite external second wiring support of the assembly. The wiring supports in this case are each formed, at least in part, from a permanently elastic, electrically insulating, thermally conductive material. Arranged between the wiring supports is at least one electronic switching element. Through the compressive force, within the electrical assembly while dispensing with integrally bonded connections, thermal and/or electrical contacts of at least the at least one switching element on an underside facing towards the first wiring support and on an upper side facing towards the second wiring support of the switching element are made. This means that the switching element and the wiring supports are brought into direct or indirect contact.

In some embodiments, the elements of the assembly have tolerances such that, before the compressive force is exerted, a minimum dimension of the assembly at right angles to a connection plane between the at least one switching element and the wiring support is at least as large as a required or highest dimension of the completed, i.e. the fully joined-together, i.e. fully produced, assembly. Through the compressive force the permanently elastic material of the first and/or the second wiring support are pushed together and/or deformed and thereby the assembly is dimensioned as required. In other words, through the tolerances of the components, despite the tolerance chain being set up by the plurality of different components within the electrical assembly, it can be insured that the electrical assembly, before the compressive force is exerted, i.e. before the final joining together of the assembly, has a predetermined minimum thickness. A tolerance band is then provided by the elasticity or deformability of the permanently elastic material. This tolerance band can then be used up during joining together, i.e. during production of the assembly, by variation or by setting of the external compressive force.

The properties and further developments of the teachings described above and below as well as the corresponding advantages are able to be transferred in each case by analogy to the method and/or to components used or able to be used for carrying out the methods and vice versa. Thus, those developments of the assembly and of the method, which have embodiments that are not explicitly described in the respective combination, also belong to the scope of the present disclosure.

In the exemplary embodiments the described components of the forms of embodiment each represent individual features of the disclosure to be considered independently of one another, which also develop the teachings independently of one another in each case and thus are to be viewed, in isolation or in a combination other than that shown, as a component of the disclosure. Furthermore, the forms of embodiment described are also able to be supplemented by further features already described.

The sole FIGURE shows an electrical assembly 1 in a schematic and cross-sectional side view. In this FIGURE, the electrical assembly comprises two wiring supports 2 each arranged lying on its outside. These are a lower wiring support 3 and an upper wiring support 4. Two power semiconductors 5 are arranged as an electronic switching element between the wiring supports 2.

With the desire for an increase in a number and density of functions or functionalities nowadays along with simultaneous miniaturization and increased performance of electrical and electronic assemblies, with known approaches to solutions problems arise both in the production and also in the thermomechanical behavior of the assemblies that cannot be overcome or can only be overcome with compromises. Known approaches to solutions essentially aim to manage the respective tolerance chain by closely specified and in some cases only uneconomically achievable individual tolerances of the individual construction elements or components of the respective assembly and thus of the individual tolerance links of the tolerance chain. In addition, compensation measures, such as for example an adaptive adaptation of solder, are sometimes employed. Damaging effects caused by different coefficients of thermal expansion of the components are to be minimized in such cases by geometrical and material-related optimization of the assemblies or structures. Here however technical and commercial limits imposed by the choice of material or by the available materials and their use in the production of the respective assembly are encountered.

In the present case, the wiring supports 2 each have a permanently elastic layer 6. The respective permanently elastic layer 6 in this case is arranged lying on the inside of the wiring support 2, which means on a side facing towards the power semiconductors 5 in each case. The permanently elastic layers 6 are made of a permanently elastic, electrically insulating material, but still of one that conducts well. Such a material can be formed for example from a polysiloxane and a ceramic filler or from a polysiloxane and aluminum oxide particles. A suitable material is known under the brand name Keratherm for example.

The fact that the permanently elastic layers 6 or their material have good thermal conductivity can mean for example that the respective permanently elastic layer 6 or its material has a thermal conductivity of at least 2 W (m·K) and/or of at least 5 W (m·K). Electrical contacting areas of the power semiconductors 5 are arranged on the inner side of the permanently elastic layers 6, between said layers and the power semiconductors 5. These contacting areas are a lower contacting area 7 between the lower wiring support 3 and the power semiconductors 5 and an upper contacting area 8 between the upper wiring support 4 and the power semiconductors 5. The contacting areas 7, 8 can for example be copper layers applied in a conventional planar process.

Components of the electrical assembly 1 in the present embodiment are thus at least the wiring supports 2, the permanently elastic layers 6 and the power semiconductors 5. The electrical contacting areas 7, 8 can also be interpreted as components, since they can involve separate specific layers. Preferably the components of the electrical assembly 1 are not integrally bonded to one another. Instead the holding together of the electrical assembly 1 is achieved by force-fit connections.

To join together the electrical assembly 1 a joining force 9, the direction of which is illustrated here schematically by arrows, is exerted on one or both of the wiring supports 2. Through the joining force 9 the electrical assembly overall and especially the material of the permanently elastic layers 6 can be pressed together. This makes it possible in a simple way during production for tolerances to be balanced out in order to bring a dimension of the electrical assembly 1 existing before the joining force 9 is exerted to a predetermined required dimension. To this end the joining force can be controlled or set matched individually to the respective electrical assembly 1. To do this it can be possible to measure the actual dimension of the electrical assembly 1 or to monitor it before and/or during the exertion of the joining force 9. In this case, through the elasticity of the permanently elastic layers 6, the joining force 9 is especially evenly distributed, whereby mechanical damage to the contacting areas 7, 8 or to the power semiconductors 5 can be avoided.

Both through the elasticity of the permanently elastic layers 6 and also by dispensing with integrally bonded connections between the components, i.e. in the connection planes of the electrical assembly 1, a package of thermally-induced mechanical strains can be avoided or at least reduced during the operation of the electrical assembly 1. Such thermomechanical strains can in particular occur with different coefficients of thermal expansion (CTE) of different, especially adjacent, components and can then lead to mismatched expansions, i.e. differences in the extent of changes to the lengths of the components, which ultimately can damage the electrical assembly 1.

Such mismatched expansions caused by different coefficients of thermal expansion (CTE mismatch) can be accommodated by the permanently elastic layers 6. For example, a respective area of the wiring support 2 facing away from the power semiconductors 5 and the permanently elastic layers 6 can be formed from a metallic material, for example aluminum. These areas can then serve as cooling areas for cooling the electrical assembly 1. However, if these metallic or aluminum areas heat up during operation of the electrical assembly 1, these expand and do so more than the power semiconductors 5 for example, which can be predominantly formed from silicon and silicon oxides. The greater thermal expansion or change in length of the metallic or aluminum areas of the wiring support 2 then leads to a deformation or to a flexing of the permanently elastic layers 6 and is not passed on to the power semiconductors 5 or at least not passed on to them to the full extent.

Dispensing with integrally bonded connections in the respective connection planes also enables the individual components to slide along one another or on one another in directions extending in the respective connection plane or in parallel thereto. The connections of the electrical assembly 1 extend in this example at right angles to a plane of the drawing between two adjacent components in each case. This sliding or independent expansion or contraction of the components in parallel to the connection plane serving to compensate for thermomechanical strains in each case is indicated schematically here by a double-ended arrow 10.

The diagram of the electrical assembly 1 shown here is merely to be understood as an example of a package. Naturally other, even more complex structures and arrangements are also possible. In this way for example further layers or areas made of the permanently elastic material of the permanently elastic layers 6 can be provided, in order to cater for mismatches otherwise occurring between further components.

LIST OF REFERENCE NUMBERS

1 Electrical assembly
2 Wiring support
3 Lower wiring support
4 Upper wiring support
5 Power semiconductor
6 Permanently elastic layer
7 Lower contacting area
8 Upper contacting area
9 Joining force
10 Double-ended arrow

The invention claimed is:

1. An electrical assembly comprising:
   a first wiring support with a first set of electrical contacts disposed on a layer of insulation;
   an electronic switching element arranged with a first side in contact with the first set of electrical contacts;
   a second wiring support with a second set of electrical contacts disposed on a layer of insulation, the second wiring support arranged opposite the first wiring support, the second set of electrical contacts in contact with a second side of the electronic switching element; and
   a force applied across the first wiring support and the second wiring support to compress the electronic switching element therebetween;
   wherein the layer of insulation for the first wiring support and the second wiring support each comprise a sheet of permanently elastic, electrically insulating, thermally conductive material; and
   wherein respective contacts between the electronic switching element and the respective sets of electrical contacts do not comprise any mechanical bonds.

2. The electrical assembly as claimed in claim 1, wherein the electronic switching element comprises a power semiconductor.

3. The electrical assembly as claimed in claim 1, wherein the permanently elastic material of the first wiring support and/or of the second wiring support is pressed onto a metallic support.

4. The electrical assembly as claimed in claim 3, wherein the metallic support comprises a cooling element for dissipating heat from the electrical assembly.

5. The electrical assembly as claimed in claim 1, wherein the permanently elastic material of the first wiring support and/or the second wiring support comprises a polysiloxane and at least one of metal oxide particles or ceramic particles.

* * * * *